US006944808B2

(12) United States Patent
Rajsuman et al.

(10) Patent No.: US 6,944,808 B2
(45) **Date of Patent: *Sep. 13, 2005**

(54) METHOD OF EVALUATING CORE BASED SYSTEM-ON-A-CHIP

(75) Inventors: Rochit Rajsuman, Santa Clara, CA (US); Hiroaki Yamoto, Santa Clara, CA (US)

(73) Assignee: Advantest Corp., Tokyo (JP)

( * ) Notice: Subject to any disclaimer, the term of this patent is extended or adjusted under 35 U.S.C. 154(b) by 402 days.

This patent is subject to a terminal disclaimer.

(21) Appl. No.: 10/225,930

(22) Filed: Aug. 22, 2002

(65) Prior Publication Data

US 2003/0056163 A1 Mar. 20, 2003

Related U.S. Application Data

(63) Continuation-in-part of application No. 09/853,999, filed on May 12, 2001.

(51) Int. Cl.[7] ................................................ G01R 31/28
(52) U.S. Cl. ....................................................... 714/724
(58) Field of Search ................................ 714/724, 726, 714/727, 728, 729, 734, 733, 738

(56) References Cited

U.S. PATENT DOCUMENTS

| | | | | |
|---|---|---|---|---|
| 6,378,093 B1 | * | 4/2002 | Whetsel | 714/726 |
| 6,425,100 B1 | * | 7/2002 | Bhattacharya | 714/724 |
| 6,556,037 B2 | * | 4/2003 | Shiraishi | 324/765 |
| 2002/0170007 A1 | * | 11/2002 | Rajsuman | 714/724 |

OTHER PUBLICATIONS

"Preliminary Outline of the IEEE P1500 Scalable Architecture for Testing Embedded Cores" IEEE VLSI Test Symposium, 1999.

"Failure Analysis for Full–Scan Circuits" International Test Conference, 1995.

"Cross Check—A Practical Solution for ASIC Testability" International Test Conference, 1989.

"On the Fault Location in Combinational Logic Circuits" 25–th Asilomar Conference.

"FINDER: A CAD System–Based Electron Beam Tester for Fault Diagnosis of VLSI Circuits" IEEE Transaction CAD, 1986.

"A Generalized Theory for System Level Diagnosis" IEEE Transaction on Computers, 1987.

"VSI Alliance Test Access Architecture Standard Version 1.0" VSI Alliance, 2001.

"VSI Alliance Test Data Interchange Formats and Guidelines for VC Providers Specification" VSI Alliance, 1999.

* cited by examiner

*Primary Examiner*—Christine T. Tu
(74) *Attorney, Agent, or Firm*—Muramatsu & Associates

(57) ABSTRACT

A method of evaluating a core based SoC detects and localizes faults in the cores or interconnects between the cores with high accuracy and observability. The method includes the steps of building two or more metal layers to create core I/O pads having all I/O pads and power pads on a surface of the top metal layer of the pad frame of each core, testing the SoC as a whole by applying test vectors to the SoC through chip I/O pads and evaluating response outputs of the SoC, testing each core in the SoC by applying core specific test vectors to the core through the core I/O pads on the top metal layer of the core and evaluating response outputs of the core, and finding a location of a fault when the fault is detected when testing the SoC chip as a whole or when testing each of the cores.

15 Claims, 9 Drawing Sheets

METHOD OF EVALUATING CORE BASED SYSTEM-ON-A-CHIP

This is a continuation-in-part of U.S. application Ser. No. 09/853,999 filed May 12, 2001.

FIELD OF THE INVENTION

This invention relates to a method of testing semiconductor devices, and more particularly, to a method of evaluating design integrity and fault diagnosis of embedded core based system-on-a-chip (SoC) ICs in a silicon form (silicon debug) with high accuracy and observability.

BACKGROUND OF THE INVENTION

In recent several years, ASIC (Application Specific Integrated Circuit) technology has evolved from a chip-set philosophy to an embedded cores based system-on-a-chip (SoC). An SoC is an IC designed by stitching together multiple stand-alone VLSI designs (cores) to provide full functionality for an application. Namely, the SoCs are built using pre-designed models of complex functions known as "cores" (also known as Intellectual Property or IP) that serve a variety of applications. These cores are generally available either in high-level description language (HDL) such as in Verilog/VHDL, or in transistor level layout such as GDS II. An SoC may contain combinations of cores of different functions such as microprocessors, large memory arrays, audio and video controllers, modem, internet tuner, 2D and 3D graphics controllers, DSP functions, and etc.

After the design stage conducted under an EDA (electronic design automation) environment, the SoC design is implemented in the form of a silicon chip. This invention is directed to a methodology for evaluating the SoC design in the form of silicon ("silicon debug") for each core as well as an SoC chip as a whole. While such system-chips serve for broad applications, the complexity of these chips is far too complex to be tested by conventional means. ("Testing embedded cores" A D&T Roundtable, IEEE Design and Test, pp.81–89, April-June 1997, "Challenge of the 90's Testing CoreWare based ASICS" Panel on "DFT for embedded cores", R. Rajsuman, International Test Conference, pp. 940, 1996).

In addition to the difficulties in the production testing, these SoCs also present major difficulty in determining their functional correctness when prototype silicon is manufactured. The primary cause of the difficulty is limited observability and controllability of individual cores. In general, only the chip I/Os (input and output of SoC chip) are accessible to apply test vectors or to observe responses to the test vectors while I/Os of each embedded core are not accessible. Thus, in a complex SoC, many internal faults do not show-up at the chip I/Os.

FIG. 1 schematically illustrates an example of general structure of SoC. In this example, an SoC 10 has an embedded memory 12, a microprocessor core 14, three function-specific cores 16, 18 and 20, PLL (phase lock loop) 22 and TAP (test access port) 24. The overall testing of SoC can be done only through the chip-level I/Os. In this example, such chip level I/Os are established by chip I/O pads 28 formed on an I/O pad frame 26 at the outer periphery of SoC 10. Each of the functional cores 12, 14, 16, 18 and

20 includes a pad frame 29 which typically contains multiple layers of I/O pads at core periphery. Generally, in IC design, the top metal layer is used for power sources (power pads 32) while intermediate metal layers are used for I/O or signal pads for interfacing with other cores, microprocessor core and embedded memory.

In the case where a failure exists, it is important to know the cause of the failure, such as whether it is due to the microprocessor core 14 or the function specific cores 16, 18 or 20, or other causes such as an interface between the cores. The reason that debugging the failure is necessary is that the failure must be corrected before the SoC design is sent to mass production.

One of the conventional technologies for fault diagnosis is based on fault dictionary (R. Rajsuman, M. Saad and B. Gupta, "On the fault location in combinational logic circuits", IEEE Asilomar Conference, pp. 1245–1250, 1991, A. k. Sonami, V. k. Agarwal and D. Avis, "A generalized theory for system level diagnosis", IEEE Trans. Computer, pp. 538–546, May 1987). An automatic test pattern generation (ATPG) tool generates many vectors for each stuck-at fault and collapses these vectors to cover each fault just once. The examples of such tools are commercial tools such as Synopsys Tetramax or tools developed in academic environment such as Socretes.

The test vector reduction in ATPG tools provides a compact test set, however, a large amount of information is lost during the test vector compaction that is vital for fault diagnosis. To overcome the loss of such information, "fault dictionary" is used, which is basically a database that lists all vectors, their corresponding faults and sometimes corresponding fault propagation cone that is active either during fault sensitization or during fault effect propagation. Traditionally, from the fault dictionary, one can identify an area (active cone) that has the fault.

One very serious limitation of this method is that it requires direct access to the internal I/Os of core so that additional test vectors from fault dictionary can be applied to identify the faulty region. Some attempts have been made to use an electron beam tester (N. Kuji, T. Tamara and M. Nagatani, "FINDER: A CAD system based electron beam tester for fault diagnosis of VLSI circuits", IEEE Trans. CAD, pp. 313–319, April 1986), or full scan circuits (K. De and A. Gunda, "Failure analysis for full-scan circuits", IEEE Int. Test Conference, pp. 636–645, 1995).

At the present time, IEEE P1500 working group is developing a solution so that core I/Os become accessible. This solution is based upon use of extra logic that includes a shift-register based wrapper at the core I/Os and a data transport bus from chip I/Os to core I/Os (IEEE P1500 web-site, http://qrouper.ieee.org/groups/1500/, "Preliminary outline of the IEEE P1500 scalable architecture for testing embedded cores", IEEE VLSI Test Symposium, 1999). This structure is illustrated in FIGS. 2A–2C where FIG. 2A shows an overall wrapper at an outer boundary of a core and FIGS. 2B and 2C respectively show structures of input cell 42 and output cell 44 in the wrapper of FIG. 2A.

Similar solutions based upon core wrapper and data transport logic have also been proposed by the Virtual Socket Interface Alliance (VSIA) and other researchers (Manufacturing related test development specification 1", version 1.0, VSI Alliance, 1998; and "Test access architecture" VSI Alliance, 2000, R. Rajsuman, "System-on-a-Chip: Design and Test", Artech House Publishers Inc., ISBN 1-58053-107-5, 2000, D. Bhattacharya, "Hierarchical test access architecture for embedded cores in an integrated circuit", IEEE VLSI Test Symposium, pp. 8–14, 1998).

The major drawbacks in these methods are that they require extra logic that increases chip size and hence the cost; and performance penalty because of the wrapper at the core I/Os. An example of such performance penalty includes signal propagation delays in SoC because of the additional circuit components and paths. Also, in all cases, a test vector is shifted-in the wrapper register and response is shifted-out using multiple clock cycles. Until the response of previous vector is completely shifted-out, a new test vector cannot be applied. Hence, these solutions cannot help in diagnosis of timing related failure because at-speed testing cannot be done. Further, in all these solutions, testing time become too long, which means excessive cost.

Another conventional approach is a "bed of nails" type method described in U.S. Pat. Nos. 4,749,947 and 4,937,826. In this method, a grid of wires is created on which the functional circuit to be tested is placed. Every node in the functional circuit can be accessed by a vertical transistor that can provide connection from node to the grid-wires. In principle, this method provides 100% observability. However, this method is extremely expensive as it requires multiple additional steps (layout masks) and modification in the existing manufacturing process of SoC. Also, because of the presence of grid of wires, it significantly increases circuit parasitic capacitance and results in performance penalty.

As in the foregoing, the conventional technologies are not satisfactory for fully debugging individual core and interconnects in SoC or identifying faulty locations in the SoC without drawbacks such as increasing the size and cost or involving the performance penalty.

SUMMARY OF THE INVENTION

It is, therefore, an object of the present invention to provide a method of debugging an individual core in a system-on-a-chip (SoC) that is simple to implement and free from the drawbacks of existing methods.

It is another object of the present invention to provide a method of debugging an individual core in a system-on-a-chip (SoC) without requiring any extra logic in the core and thus involving no performance penalty.

It is a further object of the present invention to provide a method of debugging an individual core in a system-on-a-chip (SoC) and identifying faulty interconnects between the cores or faulty locations within the core with a relatively simple procedure.

In the present invention, the I/O pad-frame of each core is duplicated in the top-level metal during the prototype manufacturing. Consequently, the I/O interface of individual core can be used for test signal application and response signal observation. The present invention makes it possible to apply a core test pattern directly to a particular core rather than an SoC chip as a whole and then, to find a location of the fault of the interconnects between the cores or wires in the core.

The method is comprised of the steps of building two or more metal layers to create core I/O pads having all I/O pads and power pads on the surface using the top metal layer of the pad frame of each core, testing the SoC as a whole by applying test vectors to the SoC through chip I/O pads and evaluating response outputs of the SoC, testing each core in the SoC by applying core specific test vectors to the core through the core I/O pads on the top metal layer of the core and evaluating response outputs of the core, and finding a location of a fault when the fault is detected when testing the SoC chip as a whole or when testing each of the cores.

In the process of finding the location of the fault, the method of the present invention differentiates whether the fault is found both in the test of the SoC chip as a whole and the test of the individual core or the fault is found only in the test of the SoC chip as a whole. Then, the method proceeds to find an interconnect between two or more cores causing the fault when the fault is found in the test of the SoC chip as a whole but not in the test of individual core. This process is done by applying test signals to the core I/O pads of one core and evaluating signals resulted from the test signals at the core I/O pads of another core for each interconnect until detecting a fault for an interconnect.

In the process of finding the location of the fault, the present invention finds a probabilistic location of faulty wire within the core causing the fault when the fault is found both in the test of the SoC chip as a whole and in the test of individual core. This process is done by applying the test vectors to the core through the core I/O pads to detect any fault in output of the core in response to the test vectors, creating a faulty wire list of wires associated with fault and a good wire list of wires without fault based on application of the test vectors, comparing entries in the good wire list and the faulty wire list and removing mismatched entries from the good wire list and sorting the remaining entries by a number of occurrence. The highest number of faulty wire indicates a highest probability that causes the fault detected by the test of individual core.

According to the present invention, the faulty core, faulty interconnect, and the location of wire (path or line) in the core can be determined using a heuristic algorithm. The method of the present invention is implemented with use of a conventional tool such as an IC tester or a logic analyzer with conventional contact probes. The present invention does not require any extra logic such as wrapper or any special equipment such as electron beam tester. When a fault is on interconnect between cores, the present invention can deterministically identify that wire. In other cases, the present method provides a probabilistic location of a line stuck-at fault in the individual core.

BRIEF DESCRIOTION OF THE DRAWINGS

Figure 2A:
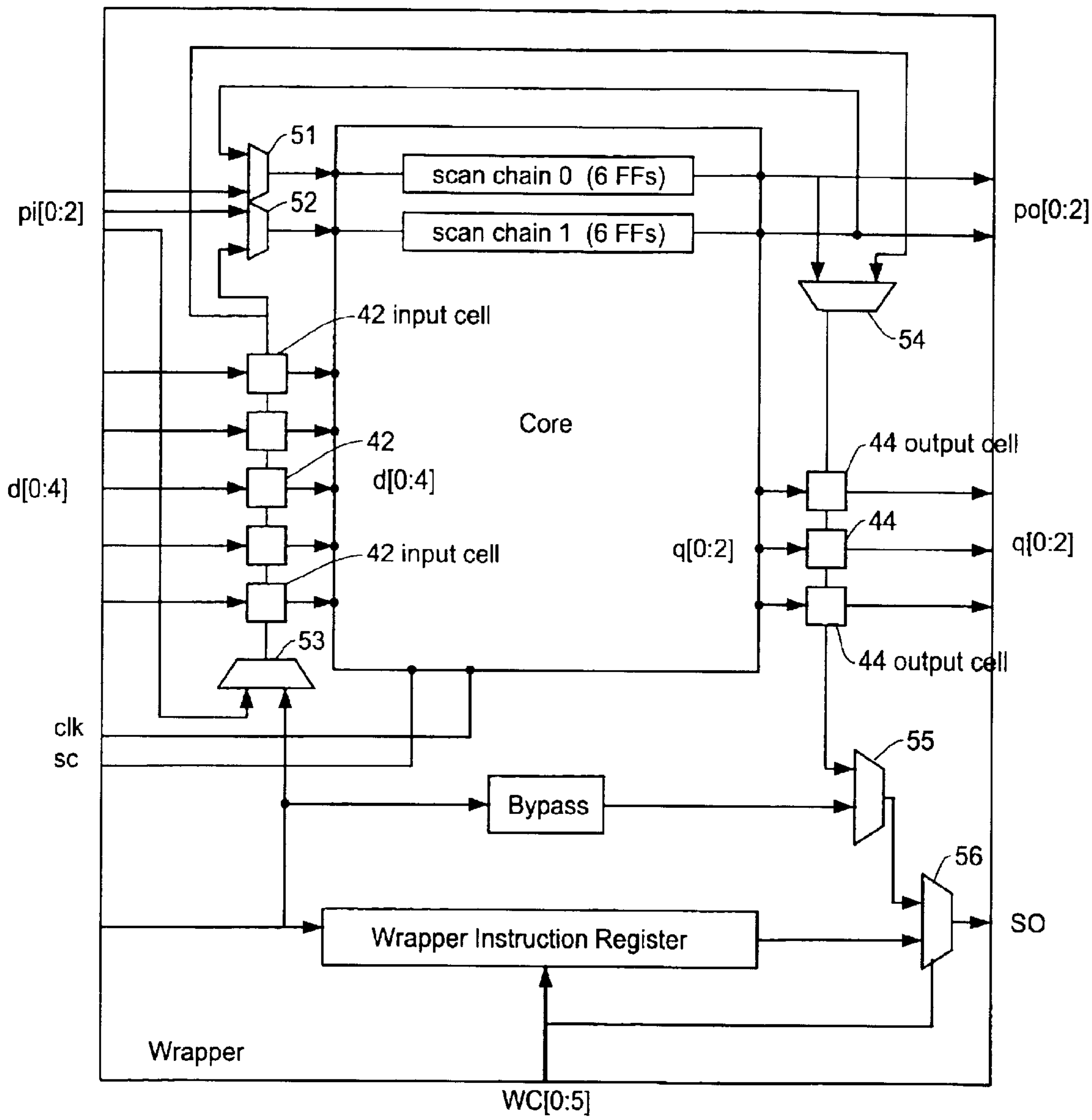
FIG. 2A is an example of overall wrapper structure proposed by IEEE P1500 working group for accessing an individual core in SoC.
Figure 2B:
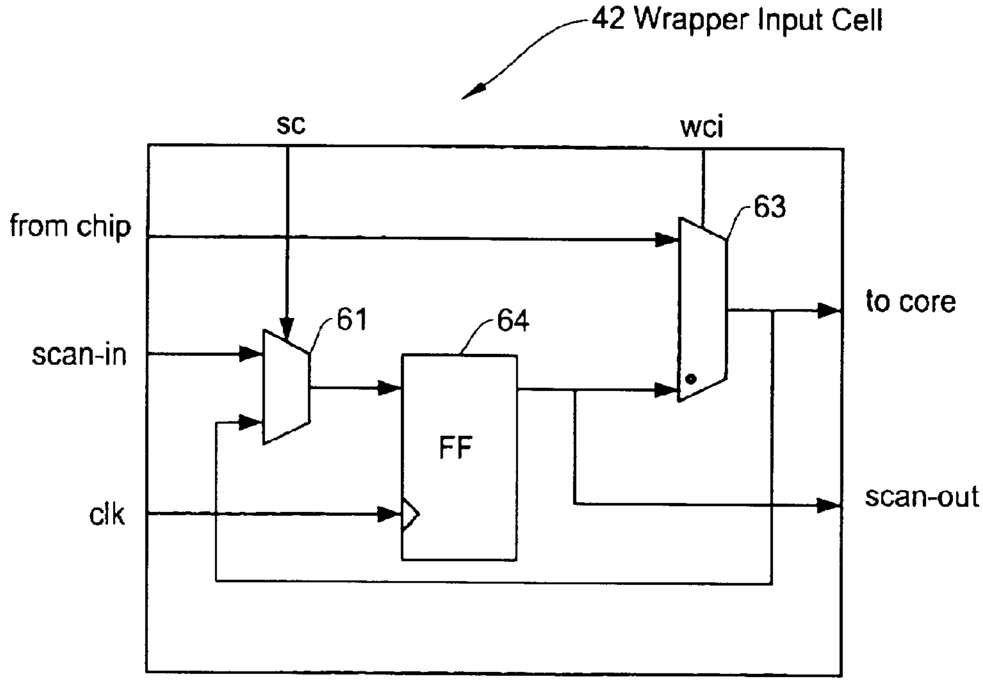
FIG. 2B is an example of structure in an input cell in the wrapper structure of FIG. 2A, and FIG.
Figure 2C:
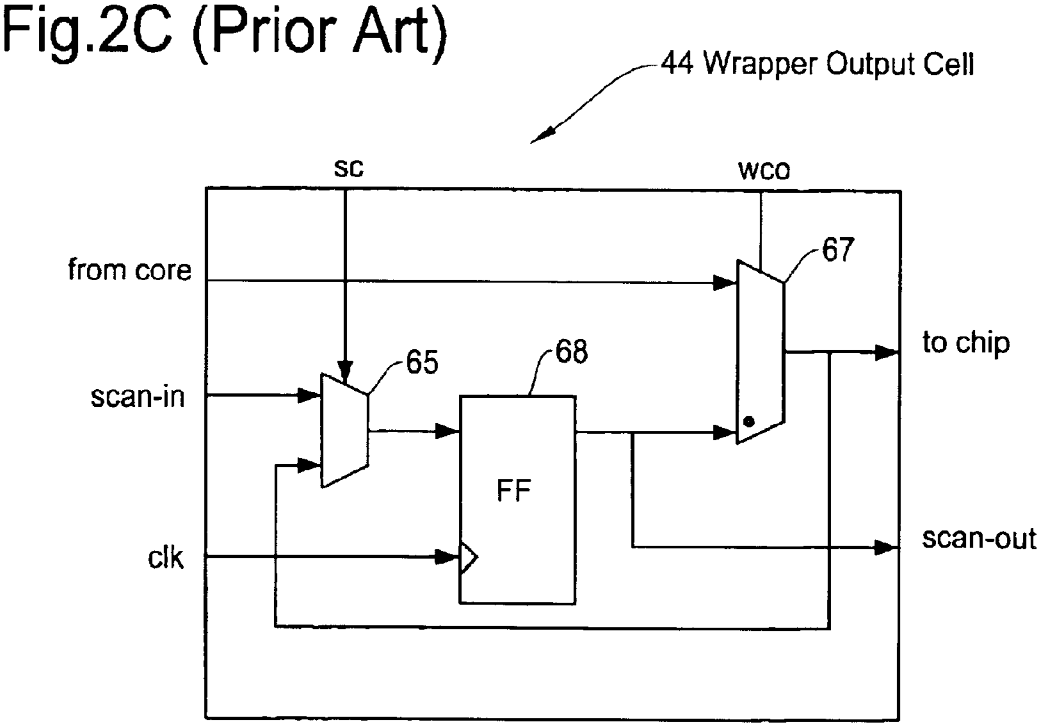

2C is an example of structure in an output cell in the wrapper structure of FIG. 2A.

Figure 3:
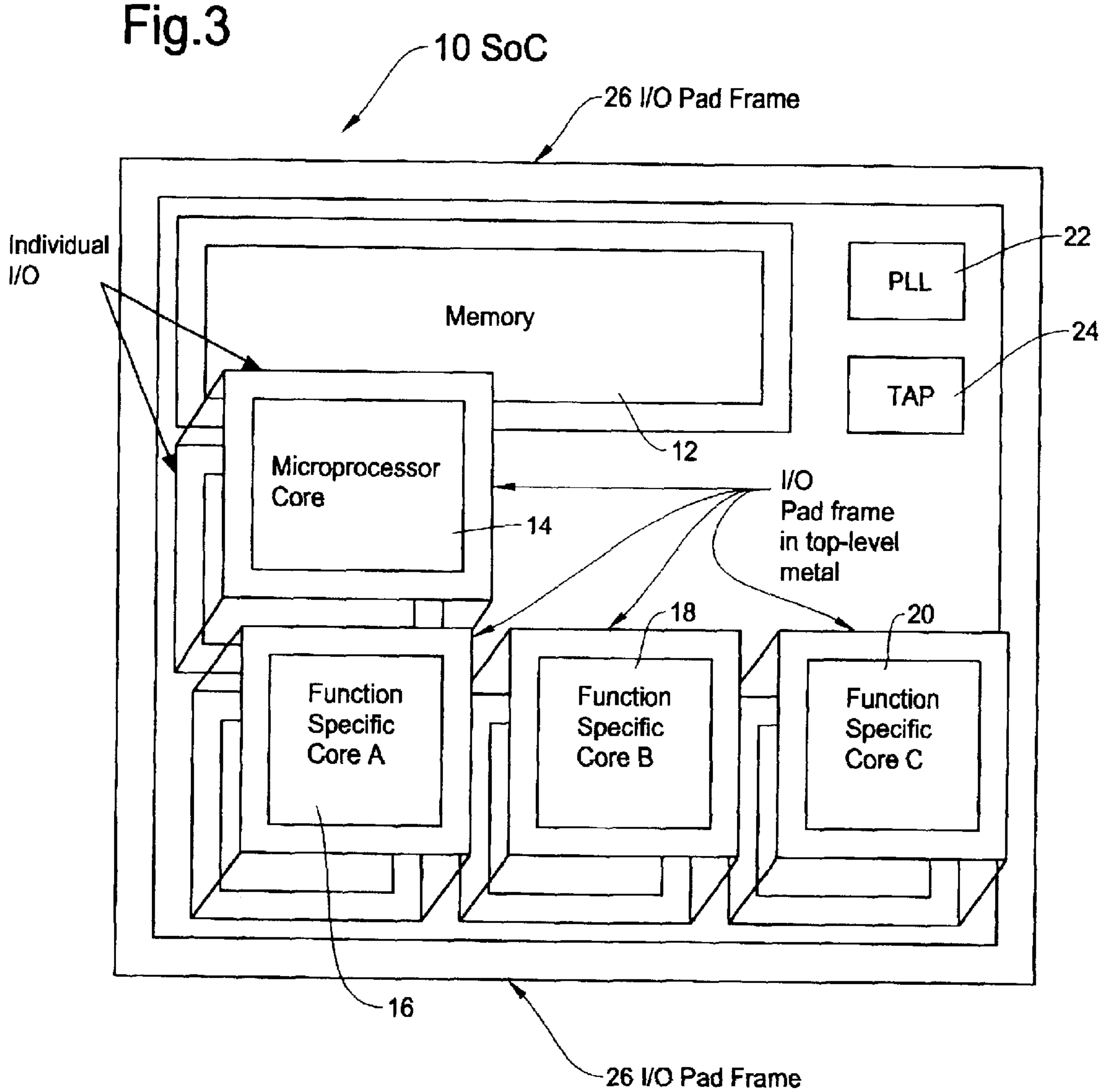

FIG. 3 is a schematic block diagram showing an example of structure in building a multiple layers of input and output (I/O) frames for each core in SoC to which the present invention is used.

Figure 4A:
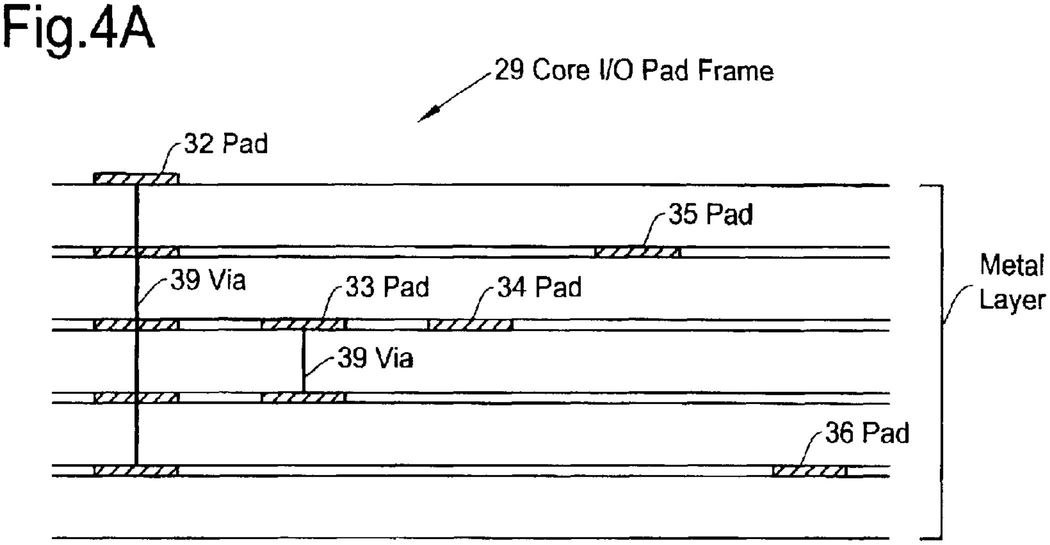
Figure 4B:
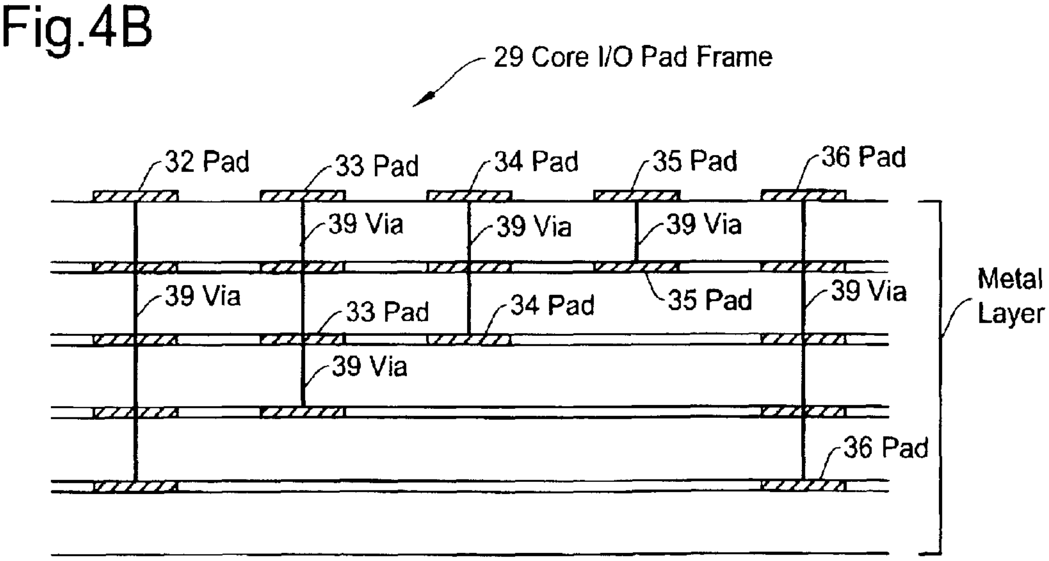

FIG. 4A shows a structure of conventional core I/O pad frame and FIG. 4B shows an example of structure in the core I/O pad frame to which present invention is implemented.

Figure 5:
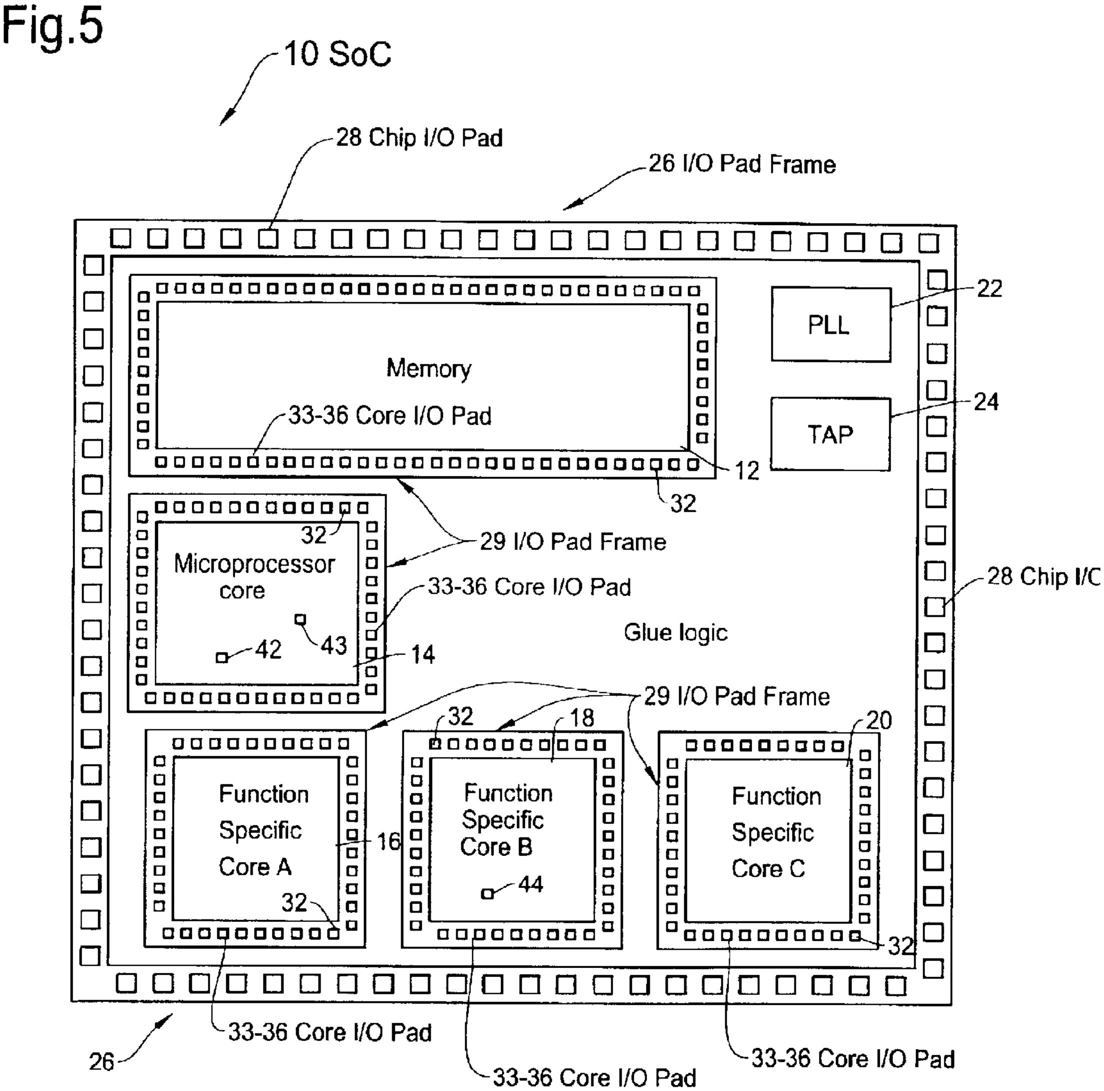

FIG. 5 is a schematic block diagram showing an example of structure in SoC having I/O pad frames in top metal layers of the cores to which the present invention is implemented.

Figure 6:
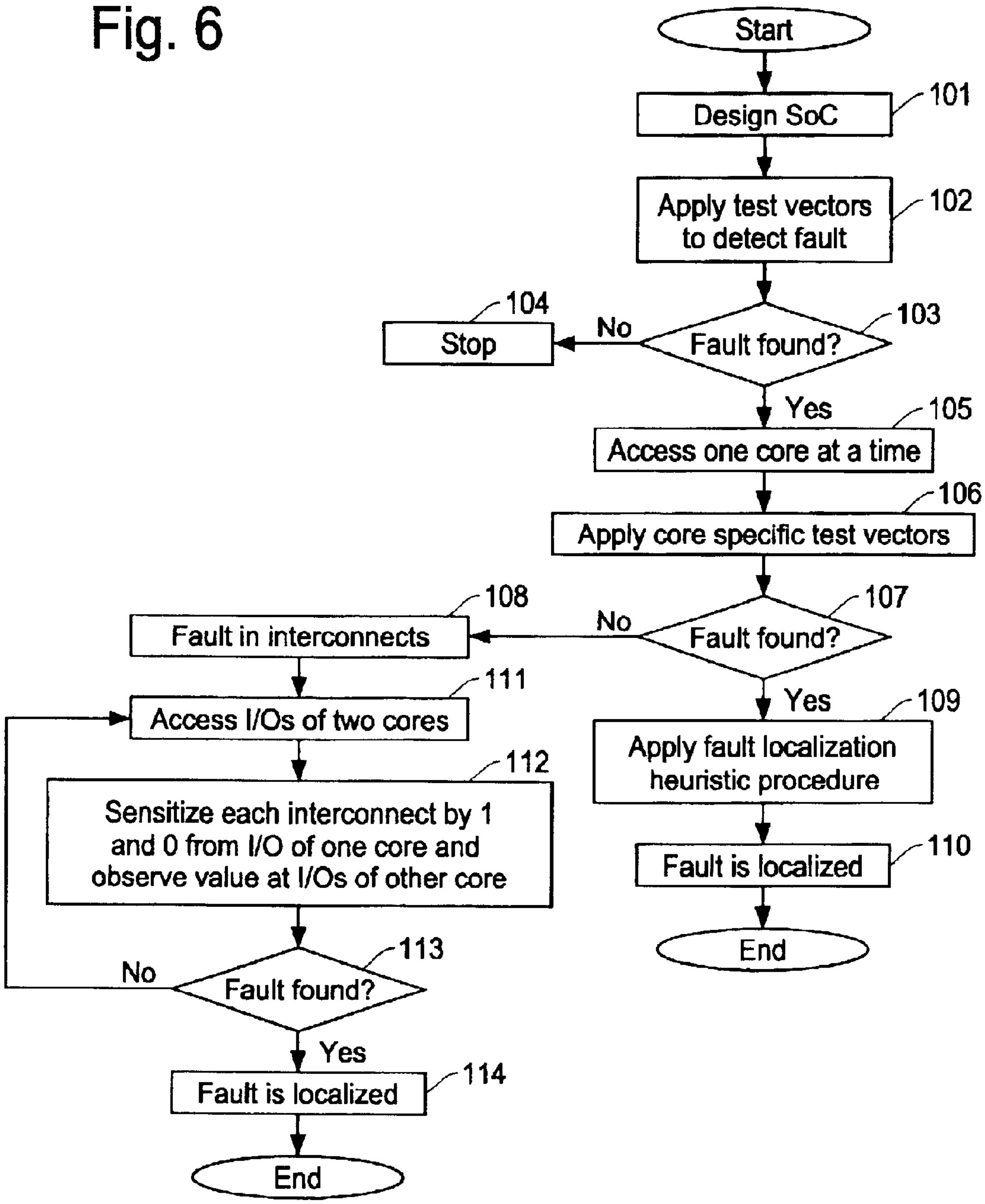

FIG. 6 is a flow chart showing the basic procedure of testing an embedded core based system-on-a-chip (SoC) in the present invention.

Figure 7:
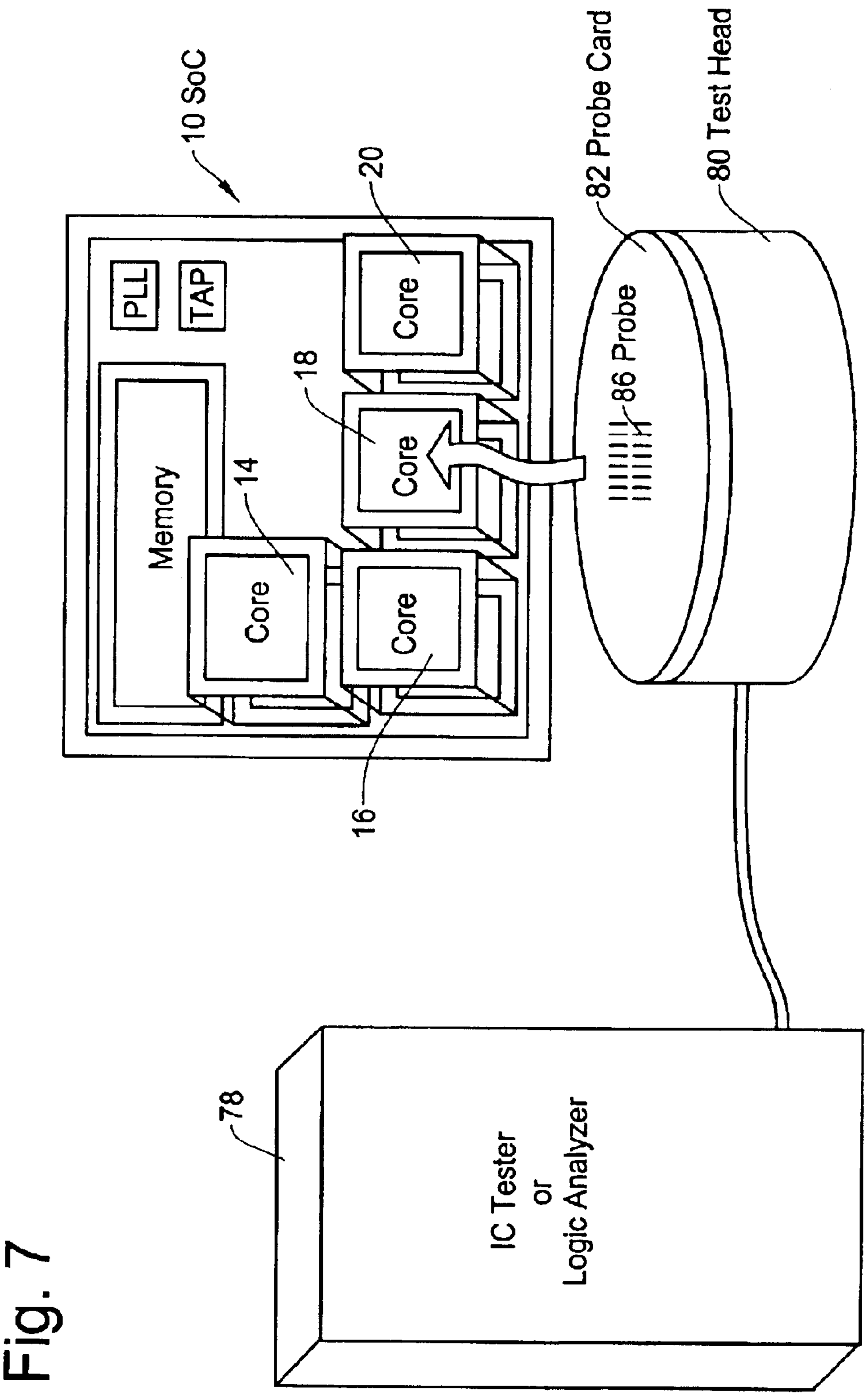

FIG. 7 is a schematic diagram showing the structural relationship among the IC tester, SoC with embedded cores specifically structured in I/O pad frames, and contact probes in the present invention.

Figure 8:
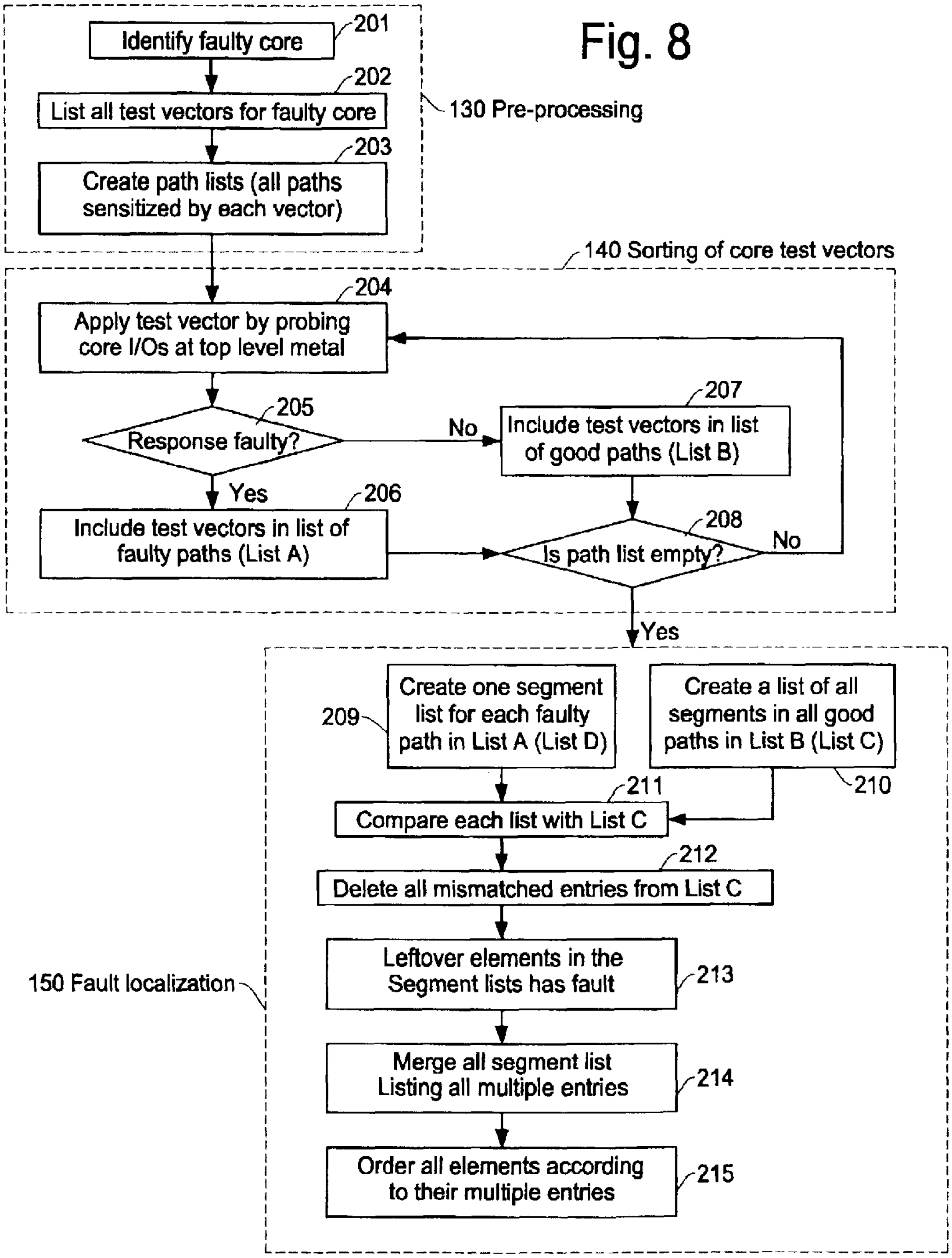

FIG. 8 is a flow chart showing the fault localization heuristic procedure in the embedded core based SoC validation method of the present invention.

DETAILED DESCRIPTION OF THE INVENTION

The present invention is now described in more detail with reference to the accompanying drawings. FIGS. 3–8 show the method of present invention for evaluating design integrity and fault diagnosis of embedded core based system-on-a-chip (SoC) ICs. FIGS. 3–5 show a special structure of SoC for testing the SoC and embedded cores therein in a silicon form (silicon debug) in accordance with the present invention. FIGS. 6–8 show the test procedures and test system structure for evaluating the SoC and embedded cores therein in the present invention. The method of the present invention is applicable only to the SoC that are designed to have the particular structure shown in FIGS. 3–5.

Referring now to FIGS. 3–5, there is shown a basic structure of an SoC to which the method of the present invention is implemented. This configuration establishes an I/O interface (I/O pads) for each core that can be directly accessible by traditional contact probes. The I/O interface of individual core can be used for test signal application and response signal observation. Consequently, it is able to apply a core test pattern (rather than a chip test pattern) directly to a particular core. Namely, the test system can access not only the SoC chip as a whole, but also each of the cores in the SoC directly through the I/O interface of the core.

More specifically, as shown in FIGS. 3 and 4, the I/O pad frame of each core is duplicated in the top-level metal during the prototype manufacturing. As noted above with reference to the prior art technology, the top-level metal layer of the I/O pad frame is generally used only for routing power lines, and lower level metal layers are used for routing signals including I/Os. Thus, it is not possible to access the individual core through the I/O pad frame of the individual core.

FIGS. 4A and 4B show a case where five metal layers are used for forming the I/O frame. FIG. 4A is directed to the conventional structure in the I/O frame while FIG. 4B is directed to the I/O frame structure used in the present invention. In the conventional technology of FIG. 4A, only the power pad 32 is connected to the top metal layer through vias 39. The pads 33–36 for signals and controls are hidden in the lower metal layers. In the configuration in FIG. 4B to which the present invention is implemented, all of the pads 32–36 in any layers are connected to the top metal layer through vias 39. Thus, all the pads 32–36 in the lower layers are duplicated to the top (5th) layer metal as shown in FIG. 4B. The connection to actual I/Os of the core to this duplicated metal pad-frame is made through the vias 39 in other layers.

Figure 1:
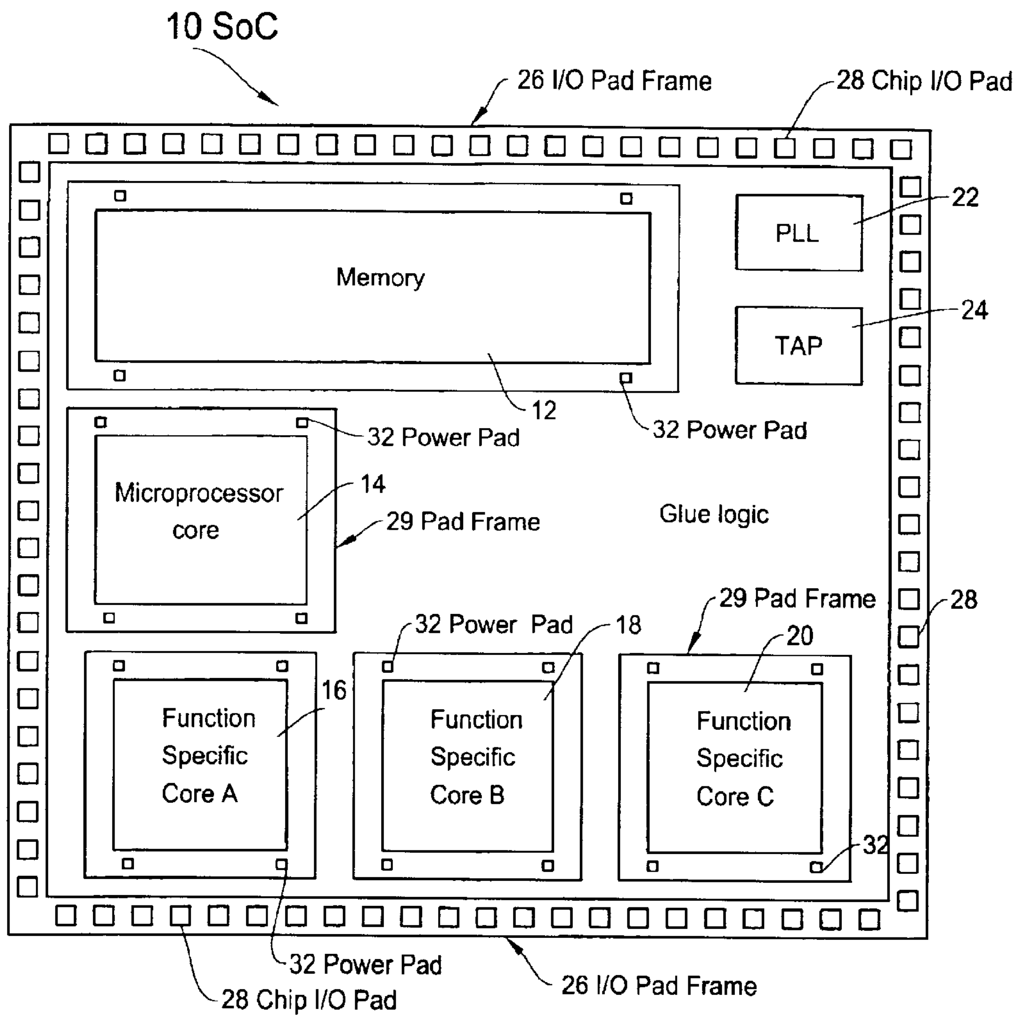
FIG. 1 is a schematic block diagram showing an example of structure in an embedded core based system-on-a-chip (SoC) including memory, microprocessor and function specific cores.

Since I/O pads of each core are brought-up to the top-level metal of the SoC without using any logic or complex sense structure, the top metal layers become simple connection points to the actual I/O pads of the core. Thus, the top-level metal layer of SoC 10 shown in FIG. 1 has only power pads, while the top-level metal of SoC shown in FIG. 5 has all I/O pads and power pads. Although not shown in FIG. 5, PLL core 22 and TAP core 24 are similarly configured in the I/O pad frame to have all of I/O pads and power pads of the cores at the top level metal.

The method of accessing the I/O pads of the core can also be used to access some key internal nodes of the core. As shown in FIG. 5, two internal nodes 42, 43 of the microprocessor core and one internal node 44 of the function specific core 18 are brought-up at the top level metal. These nodes 42, 43 and 44 can now be probed for supplying test signals or receiving response outputs.

The structure shown in FIGS. 3–5 allows complete access to each individual core in the SoC. For example, during the testing of prototype SoC, if a failure is encountered, each core can be probed individually or together with other cores (using a probe card) through the top metal level I/O pad frame. As all I/Os of the core can be probed, the core specific test vectors can be applied to determine if a particular core is faulty.

Referring to FIG. 6, the basic flow of the present invention is explained for evaluating the SoC and individual cores in the SoC. As noted above, this method is applicable only to the SoC that are designed to have the particular structure described in the foregoing with reference to FIGS. 3–5. This particular structure brings-up I/Os of an embedded core to the top level metal of the I/O frame in order to make them observable and accessible through a traditional contact mechanism. FIG. 7 shows an example of structure of the SoC and the test system of the present invention.

The method of the present invention can be implemented by a conventional tool such as an IC tester or a logic analyzer (collectively “IC tester”) with use of contact probes. Basically, an SoC chip as a whole is first tested through the chip I/O pads 28 by applying test vectors for the SoC and evaluating the response of the SoC. Then, each core is tested by applying core specific test vectors and evaluating the response of each core. If a fault is detected, an exact location of the faulty interconnect is determined. If a fault is within the core, a probabilistic location of the fault is determined.

In the test procedure of FIG. 6, at first step 101, an SoC chip 10 is designed which has a particular structure in the pad frame of each embedded core as described with reference to FIGS. 3–5. In step 102, test vectors are applied to the SoC 10 through chip I/O pads 28 on the chip I/O frame 26 shown in FIG. 5 to detect any fault of the SoC chip 10 as a whole. Typically, the test vectors are generated by a semiconductor test system such as an IC tester 78 in FIG. 7. A test head 80 is connected to the IC tester 78 to apply the test vectors to the SoC chip 10 through a probe card 82.

The probe card 82 has a large number of contact probes 86 which contact the I/O pads 28 to send the test vectors to the SoC and receive the output from the SoC. The output signals of the SoC 10 produced in response to the test vectors are evaluated by the IC tester 78, at step 103, to detect whether any fault exists. When no fault is detected, the test procedure stops at step 104 and no further action is necessary.

If a fault is detected, further testing is necessary because it is not determined as to whether the fault lies in the cores or in the interconnects. Thus, at step 105, each embedded core is accessed by the IC tester 78 through the core power pad 32 and I/O pads 33–36 shown in FIG. 5. In the present invention, as noted above, since the I/O pad frame 29 of each embedded core has the power pads 32 and the I/O pads 33–36 at the top layer, the IC tester 78 is able to directly communicate with each embedded core by contacting the contact probes 86 with the power and I/O pads 32–36. Thus, in FIG. 7, the probe card 82 contacts the core 12, 14, 16, 18 or 20 through the contact probes 86, i.e., each core is accessed one at a time and core specific test vectors for the particular core is applied thereto. Accordingly, at step 106, the embedded core receives the test vectors specific to the core from the IC tester 78 and produces resultant output signals.

The IC tester examines the response of the core as to find a fault therein in step 107. If a fault is found with respect to a particular core, the process moves to a subprocess of step 109 to further examine the core. In the present invention, the process in the step 109 is called a fault localization heuristic process and is described in detail with respect to the flow chart of FIG. 8. As a result of applying the fault localization process, when the fault is localized in step 110, the process ends. Thus, specific position of the fault and its cause are determined with highest probability and the cause of the fault will be corrected.

In the case where no fault is found in the step 107, then it is assumed, at step 108, that the fault lies in the interconnections between the cores. Thus, in step 111, the I/O pads 33–36 of two cores are accessed and each interconnect between the two cores is sensitized. For example, in step 112, the IC tester 78 applies test signals with "1" and "0" to the I/Os pads 33–36 of one core and observes the values of the signals at the I/Os pads 33–36 of another core. The IC tester 78 examine whether a fault is found in the values at the I/O pads in step 113.

This procedure identifies an exact interconnect where the fault lies. If the fault is not found in the particular interconnect, the procedure is repeated to another interconnect by accessing other I/Os pads of the two cores and sensitize each interconnect. This procedure continues until the fault found in the step 113 is detected with respect to the interconnections. If the fault is found in a particular interconnect, at step 114, the exact location of the fault, i.e, interconnect, is identified and the process ends.

FIG. 8 shows a detailed process of the fault localization heuristic step 109 in FIG. 6 for finding a specific (probabilistic) location of the fault in the embedded core. As shown in FIG. 8 by the dotted lines, the fault localization heuristic procedure consists of three major stages: (1) pre-processing 130, (2) core specific test vectors sorting 140; and (3) identification of probabilistic location of the fault 150.

In pre-processing stage 130, at step 201, a faulty core is identified based on the procedure (step 107) described above with reference to FIG. 6. In step 202, all of the core specific test vectors for the faulty core identified in the step 201 are listed in a test vector list. Further, in step 203, all the active wires (lines or paths for signal and power) corresponding to the test vectors are listed in a path list. The above procedures can be done, for example, through a host computer (not shown) of the IC tester 78, such as an engineering workstation.

In the stage 140 for sorting the core specific test vectors, at step 204, through the IC tester 78 and the contact probes 86, all the core specific test vectors are applied to the faulty core and the response of the core is observed. The test vectors are applied to the core by probing the core I/Os pads at the top level metal on the I/O frame. The IC tester 78 examines whether the response output contains a fault in step 205. If the response is faulty, then the test vector corresponding to the fault is listed in a faulty path list (list A) at step 206. If the response is not faulty, the corresponding test vectors are listed in a good path list (list B) at step 207. Thus, two lists are created into which test vectors are sorted and listed based on whether the test vector produced the faulty output or not. The two lists also include information on the wires (paths) corresponding to test vectors. This procedure of sorting test vectors based on the response is repeated in step 208 until all the entries in the path list created in the pre-processing stage 130 are exhausted.

The stage 150 for identification of probabilistic location of the fault starts when the all the entries in the path list are exhausted in the step 208. Then, in step 209, one segment list for each faulty path in the list A is created (list D) based on the list A and the path list created in the pre-processing 130. In step 210, a list of all segments of all good paths is created (list C) based on the list B and the path list created in the pre-processing 130. The entry in the list D is compared with the entries in the list C at step 211. If the entry in the list D mismatches the entry in the list C, such entries in the list C are removed from the list C at step 212. This procedure is repeated until all the entries in List C are compared. Effectively, the step 212 removes all good segments from the list C, i.e., only those segments left in the list C are those also in the list D.

Thus, after the above procedure, if an entry or entries remain in the list C, it is assumed in step 213, that such leftover segments (wires) in the list C have faults. In step 214, all the segments in the list C are merged, and in step 215, the segments are sorted in the order of number of occurrence. Thus, if a particular wire has seven left-over entries and the other wire has three entries, then the wire having seven entries is ordered first. The segment (wire) having the largest number of entries indicates the highest probability of having fault.

As has been foregoing, in the present invention, the faulty core, faulty interconnect, and the location of wire (path or line) in the core can be determined in a heuristic procedure. In determining the location of the fault in the core, a probabilistic location of a line stuck-at fault is determined. On the other hand, it is possible to assess the exact location of fault in the interconnect. The present invention does not require any extra logic such as wrapper or any special equipment such as electron beam tester. Since it does not use any extra logic, there is no performance penalty. The core test pattern can be applied to the core through the core I/O pads at speed to debug any functional and timing related fault.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A method of evaluating a system-on-a-chip IC (SoC), comprising the following steps of:

building two or more metal layers to establish a pad frame and internal circuit nodes for each core in an SoC while connecting I/O (input and output) pads on a lower metal layer to a top metal layer, thereby creating core I/O pads having all I/O pads and power pads on a surface of the top metal layer of the pad frame of each core;

testing the SoC as a whole by applying test vectors to the SoC through chip I/O pads and evaluating response outputs of the SoC received through the chip I/O pads;

testing each core in the SoC by applying core specific test vectors to the core through the core I/O pads on the top metal layer of the core and evaluating response outputs of the core received through the core I/O pads; and finding a location of a fault when the fault is detected either when testing the SoC chip as a whole or when testing each core.

2. A method of evaluating a system-on-a-chip (SoC) as defined in claim 1, wherein the step of finding the location of the fault includes a step of differentiating as to whether the fault is found both in the test of SoC chip as a whole and the test of individual core or the fault is found only in the test of SoC chip as a whole.

3. A method of evaluating a system-on-a-chip (SoC) as defined in claim 2, wherein the step of finding the location of the fault includes a step of finding a location of an interconnect between two cores causing the fault when the fault is found in the test of the SoC chip as a whole but not in the test of each core.

4. A method of evaluating a system-on-a-chip (SoC) as defined in claim 3, wherein the step of finding the interconnect includes a step of applying test signals to the core I/O pads of one core and evaluating signals resulted from the test signals at the core I/O pads of another core for each interconnect until detecting a fault.

5. A method of evaluating a system-on-a-chip (SoC) as defined in claim 2, wherein the step of finding the location of the fault includes a step of finding a probabilistic location of faulty wire within the core causing the fault when the fault is found both in the test of SoC chip as a whole and in the test of each core.

6. A method of evaluating a system-on-a-chip (SoC) as defined in claim 5, wherein the step of finding the probabilistic location of the faulty wire within the core includes the steps of:

applying the test vectors to the core through the core I/O pads to detect any fault in output of the core produced in response to the test vectors;

creating a faulty wire list of wires associated with fault and a good wire list of wires without fault based on results of application of the test vectors;

comparing entries in the good wire list and the faulty wire list and removing mismatched entries from the good wire list and sorting the remaining entries by a number of occurrence;

where a highest number of faulty wire indicates highest probability that causes the fault detected by the test of individual core.

7. A method of evaluating a system-on-a-chip (SoC) as defined in claim 5, wherein the step of finding the probabilistic location of the faulty wire within the core includes the steps of:

creating a test vector list of all test vectors applied to the core in which the fault is detected and a paths list of active wires sensitized by the test vectors;

applying the test vectors to the core through the core I/O pads to detect any fault in output of the core produced in response to the test vectors;

creating a faulty test vector list of the test vectors corresponding to a fault in the output of the core and a good test vector list of the test vectors without fault;

creating a faulty wire list of wires associated with fault with use of the paths list and the faulty test vector list;

creating a good wire list of wires without fault with use of the paths list and the good test vector list;

comparing entries in the good wire list and the faulty wire list and removing inconsistent entries from the good wire list; and sorting the entries remained in the good wire list by a number of occurrence;

where a highest number of faulty wire indicates a highest probability that causes the fault detected by the test of individual core.

8. A method of evaluating a system-on-a-chip (SoC) as defined in claim 1, wherein the step of building the metal layers of core includes a step of connecting the internal circuit node in the core to a contact pad at the top metal layer, thereby making accessible of the internal circuit node and the I/O pads by contact probes.

9. A method of evaluating a system-on-a-chip (SoC) as defined in claim 1, wherein the step of connecting the I/O pads to the top metal layer includes a step of using metal vias between a lower metal layer and an upper metal layer of the pad frame, thereby duplicating the I/O pads toward the top metal layer.

10. A method of evaluating a system-on-a-chip IC (SoC), comprising the following steps of:

building two or more metal layers to establish a pad frame and internal circuit nodes for each core in an SoC while connecting I/O (input and output) pads on a lower metal layer to a top metal layer, thereby creating core I/O pads having all I/O pads and power pads on a surface of the top metal layer of the pad frame of each core;

testing the SoC as a whole by applying test vectors to the SoC through chip I/O pads and evaluating response outputs of the SoC received through the chip I/O pads;

testing individual core in the SoC by applying core specific test vectors to the core through the core I/O pads on the top metal layer of the core and evaluating response outputs of the core received through the core I/O pads;

finding an interconnect between two or more cores causing the fault when the fault is found in the test of the SoC chip as a whole but not in the test of the individual core; and finding a probabilistic location of faulty wire within the core causing the fault when the fault is found both in the test of the SoC chip as a whole and in the test of the individual core.

11. A method of evaluating a system-on-a-chip (SoC) as defined in claim 10, wherein the step of finding the interconnect includes a step of applying test signals to the core I/O pads of one core and evaluating signals resulted from the test signals at the core I/O pads of another core for each interconnect until detecting a fault.

12. A method of evaluating a system-on-a-chip (SoC) as defined in claim 10, wherein the step of finding the probabilistic location of the faulty wire within the core includes the steps of:

applying the test vectors to the core through the core I/O pads to detect any fault in output of the core produced in response to the test vectors;

creating a faulty wire list of wires associated with fault and a good wire list of wires without fault based on results of application of the test vectors;

comparing entries in the good wire list and the faulty wire list and removing mismatched entries from the good wire list and sorting the remaining entries by a number of occurrence;

where a highest number of faulty wire indicates highest probability that causes the fault detected by the test of individual core.

13. A method of evaluating a system-on-a-chip (SoC) as defined in claim 10, wherein the step of finding the probabilistic location of the faulty wire within the core includes the steps of:

creating a test vector list of all test vectors applied to the core in which the fault is detected and a paths list of active wires sensitized by the test vectors;

applying the test vectors to the core through the core I/O pads to detect any fault in output of the core produced in response to the test vectors;

creating a faulty test vector list of the test vectors corresponding to a fault in the output of the core and a good test vector list of the test vectors without fault;

creating a faulty wire list of wires associated with fault with use of the paths list and the faulty test vector list;

creating a good wire list of wires without fault with use of the paths list and the good test vector list;

comparing entries in the good wire list and the faulty wire list and removing inconsistent entries from the good wire list; and sorting the entries remained in the good wire list by a number of occurrence;

where a highest number of faulty wire indicates a highest probability that causes the fault detected by the test of individual core.

14. A method of evaluating a system-on-a-chip (SoC) as defined in claim 10, wherein the step of building the metal layers of core includes a step of duplicating the internal circuit node in the core to the top metal layer, thereby making accessible of the internal circuit node and the I/O pads by contact probes.

15. A method of evaluating a system-on-a-chip (SoC) as defined in claim 10, wherein the step of connecting the I/O pads to the top metal layer includes a step of using metal vias between a lower metal layer and an upper metal layer of the pad frame, thereby duplicating the I/O pads toward the top metal layer.

* * * * *